US011066335B2

(12) United States Patent
Li et al.

(10) Patent No.: US 11,066,335 B2
(45) Date of Patent: Jul. 20, 2021

(54) ARTICLES FOR CREATING HOLLOW STRUCTURES IN CERAMIC MATRIX COMPOSITES

(71) Applicant: GENERAL ELECTRIC COMPANY, Schenectady, NY (US)

(72) Inventors: Tao Li, Blue Ash, OH (US); Timothy P. Coons, Cincinnati, OH (US); Xi Yang, Alpha, OH (US); Michael James Weimer, Loveland, OH (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 262 days.

(21) Appl. No.: 15/696,869

(22) Filed: Sep. 6, 2017

(65) Prior Publication Data

US 2019/0071363 A1    Mar. 7, 2019

(51) Int. Cl.
*C04B 35/80* (2006.01)
*B33Y 80/00* (2015.01)
(Continued)

(52) U.S. Cl.
CPC .............. *C04B 35/80* (2013.01); *B28B 7/342* (2013.01); *B28B 23/0006* (2013.01); *B32B 18/00* (2013.01); *C04B 35/62844* (2013.01); *C04B 35/62873* (2013.01); *C04B 35/62884* (2013.01); *C04B 35/62886* (2013.01);
(Continued)

(58) Field of Classification Search
CPC ... C04B 35/80; C04B 35/64; C04B 35/62844; C04B 2235/616; C04B 35/657; C04B 35/62886; C04B 2237/62; C04B 2237/38; C04B 2237/365; C04B 2235/5244;
(Continued)

(56) References Cited

U.S. PATENT DOCUMENTS 5,976,457 A    11/1999    Amaya et al.
6,155,331 A    12/2000    Langer et al.
(Continued)

FOREIGN PATENT DOCUMENTS

CN    102741043 A    10/2012
CN    103030416 A    4/2013
(Continued)

OTHER PUBLICATIONS

European Search Report issued in connection with related EP Application No. 18189778.6 dated Nov. 20, 2018.
(Continued)

*Primary Examiner* — Joseph S Del Sole
*Assistant Examiner* — Mohamed K Ahmed Ali
(74) *Attorney, Agent, or Firm* — Dority & Manning, P.A.

(57) ABSTRACT

The present disclosure relates to a method of fabricating a ceramic composite components. The method may include providing at least a first layer of reinforcing fiber material which may be a pre-impregnated fiber. An additively manufactured component may be provided on or near the first layer. A second layer of reinforcing fiber, which may be a pre-impregnated fiber may be formed on top the additively manufactured component. A precursor is densified to consolidates at least the first and second layer into a densified composite, wherein the additively manufactured material defines at least one cooling passage in the densified composite component.

9 Claims, 7 Drawing Sheets

(51) Int. Cl.
*C04B 35/628* (2006.01)
*C04B 35/657* (2006.01)
*C04B 35/64* (2006.01)
*B28B 7/34* (2006.01)
*C04B 38/06* (2006.01)
*B28B 23/00* (2006.01)
*C04B 38/08* (2006.01)
*B32B 18/00* (2006.01)
*F01D 5/28* (2006.01)
*B29C 64/135* (2017.01)
*C23C 16/04* (2006.01)

(52) U.S. Cl.
CPC ............ *C04B 35/64* (2013.01); *C04B 35/657* (2013.01); *C04B 35/806* (2013.01); *C04B 38/06* (2013.01); *C04B 38/08* (2013.01); *F01D 5/282* (2013.01); *B29C 64/135* (2017.08); *B33Y 80/00* (2014.12); *C04B 2235/422* (2013.01); *C04B 2235/5216* (2013.01); *C04B 2235/5244* (2013.01); *C04B 2235/6028* (2013.01); *C04B 2235/614* (2013.01); *C04B 2235/616* (2013.01); *C04B 2237/365* (2013.01); *C04B 2237/38* (2013.01); *C04B 2237/62* (2013.01); *C23C 16/045* (2013.01); *F05D 2300/211* (2013.01); *F05D 2300/6012* (2013.01); *F05D 2300/6033* (2013.01)

(58) Field of Classification Search
CPC ....... C04B 35/83; C04B 35/622; B32B 18/00; B28B 23/0006
See application file for complete search history.

(56) References Cited

U.S. PATENT DOCUMENTS

| | | | |
|---|---|---|---|
| 6,274,078 | B1 | 8/2001 | Dunyak et al. |
| 6,428,740 | B2 | 8/2002 | Dunyak et al. |
| 6,746,755 | B2 | 6/2004 | Morrison et al. |
| 9,079,357 | B2 | 7/2015 | Ebert et al. |
| 9,381,564 | B2 | 7/2016 | McGuire et al. |
| 2010/0045950 | A1 | 2/2010 | Kemper et al. |
| 2011/0310370 | A1 | 12/2011 | Rohner et al. |
| 2012/0248657 | A1* | 10/2012 | Ebert ................. B29C 64/20 264/401 |
| 2013/0017094 | A1 | 1/2013 | Coupe et al. |
| 2013/0084189 | A1 | 4/2013 | Diego et al. |
| 2016/0115086 | A1 | 4/2016 | Tuertscher et al. |
| 2016/0346831 | A1 | 12/2016 | Snyder et al. |
| 2017/0008072 | A1 | 1/2017 | Cui et al. |
| 2017/0056963 | A1 | 3/2017 | Bartels et al. |
| 2017/0074205 | A1* | 3/2017 | Maki ................. B22C 9/108 |

FOREIGN PATENT DOCUMENTS

| | | |
|---|---|---|
| CN | 103373862 A | 10/2013 |
| CN | 105308269 A | 2/2016 |
| EP | 2657209 A1 | 10/2013 |
| JP | 2009/137839 A | 6/2009 |
| JP | 2012206513 A | 10/2012 |
| JP | 2016522348 A | 7/2017 |

OTHER PUBLICATIONS

Takeshi et al., "Development of CMC Turbine Parts for Aero Engines" IHI Engineering Review, vol. 47, No. 1, 2014, pp. 29-32.
Japanese Patent Office, Notice of Reasons for Rejection issued in corresponding Application Serial No. 2018-159963 dated Nov. 12, 2019.
Combined Chinese Search Report and Office Action Corresponding to Application No. 201811031792 dated Jan. 12, 2021.
Machine Translated Japanese Office Action Corresponding to Application No. 2018159963 dated Jun. 29, 2020.

* cited by examiner

ARTICLES FOR CREATING HOLLOW STRUCTURES IN CERAMIC MATRIX COMPOSITES

INTRODUCTION

The disclosure generally relates to ceramic matrix composites (CMC), particularly to cooling passages formed within a CMC structure.

BACKGROUND

A gas turbine engine generally includes at least one compressor to pressurize air to be channeled into a combustor. The engine may include at least one combustor in which at least a portion of the channeled pressurized air is mixed with fuel and ignited. Hot gasses from the compressor flow downstream through at least one turbine section. Each turbine section has rotating blades rotating about an axis and contained within an engine housing. The turbine section or sections may power any one of the compressor, a fan, a shaft, and/or may provide thrust through expansion through a nozzle, for example.

The turbine blades, stator veins, shrouds, combustors, and/or nozzles in the turbine portions must be able to withstand thermal stresses due to high temperatures and large temperature fluctuations as well as forces due to the high rotational speed experienced during normal operation of the turbine. As the pressure ratio and efficiency of turbines have increased, the thermal stresses the high pressure and low pressure turbine portion are exposed to have also increased. Accordingly, in combination with manufacturing components of the turbine (e.g. turbine blades and stator veins) from a high-temperature resistant material, effective cooling of the turbine blades, stator veins and other components have become increasingly important and challenging. To counteract the radiation and convection of heat to the turbine section, several heat removal techniques have been employed in the past; fluid cooling is generally employed to prolong the life of the turbine components. Further, small cooling holes have been drilled though the blade at angles optimized to remove heat and provide a thermal barrier on the surface of each airfoil surface of the turbine blades and stator veins. Passages are also formed within the turbine and/or stator veins to provide convection cooling of the surface of each airfoil. Generally, cooling air is extracted from the compressor portion of the turbine, and results in parasitic loss; however, the improvement in efficiency due to higher temperatures within the turbine generally outweighs the parasitic losses from extracting cooling air.

The desire for increased cooling efficiency within turbine engine has led to complex internal cooling passages within turbine components. Conventional techniques for manufacturing engine parts and components involve the process of investment or lost-wax casting. One example of investment casting involves the manufacture of a typical blade used in a gas turbine engine. A turbine blade and/or stator vein typically includes hollow airfoils that have radial channels extending along the span of a blade having at least one or more inlets for receiving pressurized cooling air during operation of the engine. Various cooling passages in a blade typically include a serpentine channel disposed in the middle of the airfoil between the leading and trailing edges. The airfoil typically includes inlets extending through the blade for receiving pressurized cooling air, which include local features such as short turbulator ribs or pins for increasing the heat transfer between the heated sidewalls of the airfoil and the internal cooling air.

Back side cooling can also be employed to components that have a front side exposed to combustion gasses. Generally, in back side cooling schemes the cooling fluid is extracted from the compressor. Back side cooling is advantageous in that injected fluid does not dilute or effect the combustion air and can be supplied at a lower pressure than would be needed for film cooling. However, back side cooling primarily creates a temperature gradient across the thickness of the wall to be cooled. Accordingly, back side cooling becomes less effective as the thickness of the wall of the cooled component increases.

Insulating materials, such as thermal barrier coatings (TBC) have been employed for protecting components subject to high temperature gradients through insulation of the component. In the past, TBC's were generally employed to protect an underlying metallic component, and could also be employed to improve the corrosion characteristics of the underlying metallic material.

In order to further increase the thermal stress resistance of turbine components, ceramic matrix composites (CMC's), particularly SiC/SiC matrix composites have been employed in various components of gas turbine engines. CMC components have a higher heat resistance than nickel-based superalloys used in turbines and thus offer the potential for higher operating temperatures within the turbine. Further, CMC's are lighter in weight than most alloys. Accordingly, employing CMC's into turbines can also improve the power to weight ratio of turbine engines. Further advances in thermal stress resistance have been attempted by employing cooling passages in CMC components.

CMC components, more specifically SiC/SiC composites may be processed using several different methods. The most common processes are melt Infiltration, polymer impregnation and pyrolysis, and chemical vapor infiltration. In order to form passages in CMC components, such as for trailing edge cooling holes in nozzles or for cooling passages in turbine or compressor blades and/or veins, fugitive quartz rods are used which are removed after curing of the component. However, quartz rods pose the problem of brittleness as well as uniformity of removal. Frequently quartz rods may be incompletely removed which leads to blind cooling holes. Further, the use of quartz rods greatly limits the design of cooling passages to linear passages. Laser drilling has also been used to form cooling holes in CMC components. Laser drilling poses similar design limitations as only linear passages may be formed.

BRIEF DESCRIPTION OF THE INVENTION

In one aspect of the disclosure, a method of fabricating a composite component is disclosed. The method comprises at least partially covering a core having an organic binder and at least a silicon component with a reinforcing fiber material, wherein the core includes at least one portion having a non-linear geometry.

The abovementioned silicon component may comprise at least on of an Si, SiO, and an $SiO_2$. Further, the method may include performing an infiltration process with a ceramic matrix precursor material, wherein the precursor is densified and consolidates at least a first and second layer of the reinforcing fiber material into a densified composite, wherein the core defines at least one cooling passage in the densified composite component. In another aspect, the reinforcing fiber material may be pre-impregnated with a ceramic matrix precursor material.

In another aspect, the reinforcing fiber may be pre-impregnated with a ceramic matric precursor material. further, the abovementioned process of covering the core may further include placing the core on at least one first layer of the pre-impregnated reinforced fiber material; adding a second layer of pre-impregnated reinforcing fiber material on top of the core, and densifying and consolidating at least the first and second layer of reinforcing fiber such that the core defines at least one cooling passage in the completed ceramic matrix component.

In one aspect the abovementioned core may be removed to define the at least one cooling passage. As an alternative or in combination with the removed core, the core may include a hollow passage that defines at least one cooling passage in the completed CMC component.

In any of the abovementioned or below mentioned aspects, the core may be formed by contacting a cured portion of a workpiece with a liquid photopolymer; irradiating a portion of the liquid photopolymer adjacent to the cured portion through a window contacting the liquid photopolymer; removing the workpiece from the uncured liquid photopolymer; and repeating the steps listed above until the core is formed.

In one aspect of the disclosure, a method of fabricating a composite component is disclosed. The method comprises at least partially covering a core having an organic binder and at least one of Si, SiO, and SiO2 with a reinforcing fiber material, wherein the core defines at least one cooling passage in the composite component.

In another aspect of the disclosure, a method of fabricating a composite component is disclosed. The method comprises covering at least a portion of a first layer of reinforcing fiber material with a core portion. A second layer of reinforcing fiber material is added on top of the core portion. After the layup is completed the method further comprises densifying and consolidating at least the first and second layer of reinforcing fiber into a densified composite, wherein the core portion includes a portion having a non-linear geometry and defines at least one cooling passage in the densified composite component.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

DETAILED DESCRIPTION

While the aspects described herein have been described in conjunction with the example aspects outlined above, various alternatives, modifications, variations, improvements, and/or substantial equivalents, whether known or that are or may be presently unforeseen, may become apparent to those having at least ordinary skill in the art. Accordingly, the example aspects, as set forth above, are intended to be illustrative, not limiting. Various changes may be made without departing from the spirit and scope of the disclosure. Therefore, the disclosure is intended to embrace all known or later-developed alternatives, modifications, variations, improvements, and/or substantial equivalents.

Figure 1:
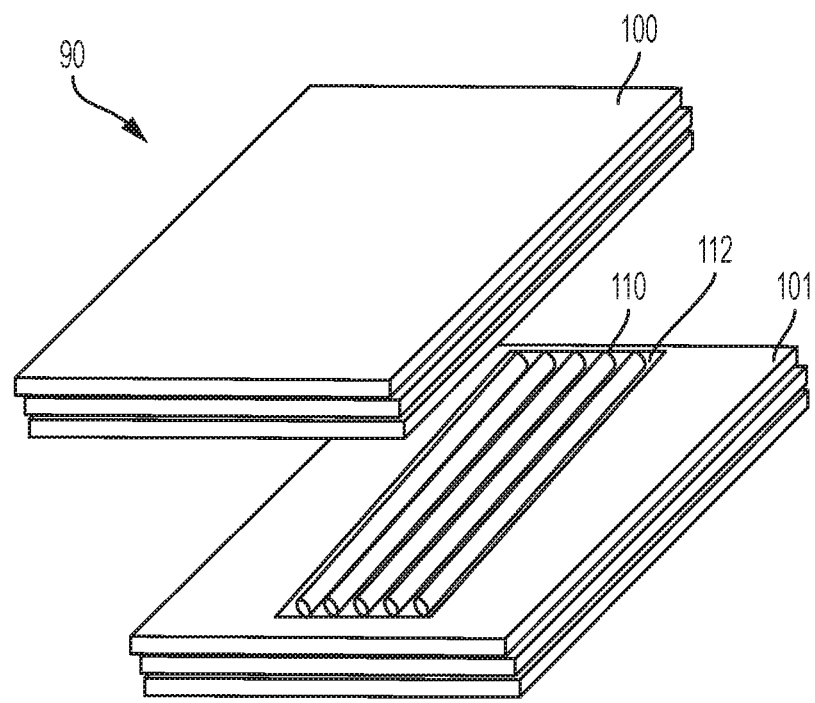
FIG. 1 is a simplified perspective view of a conventional method of adding cooling passages using fugitive rods.
Figure 2:
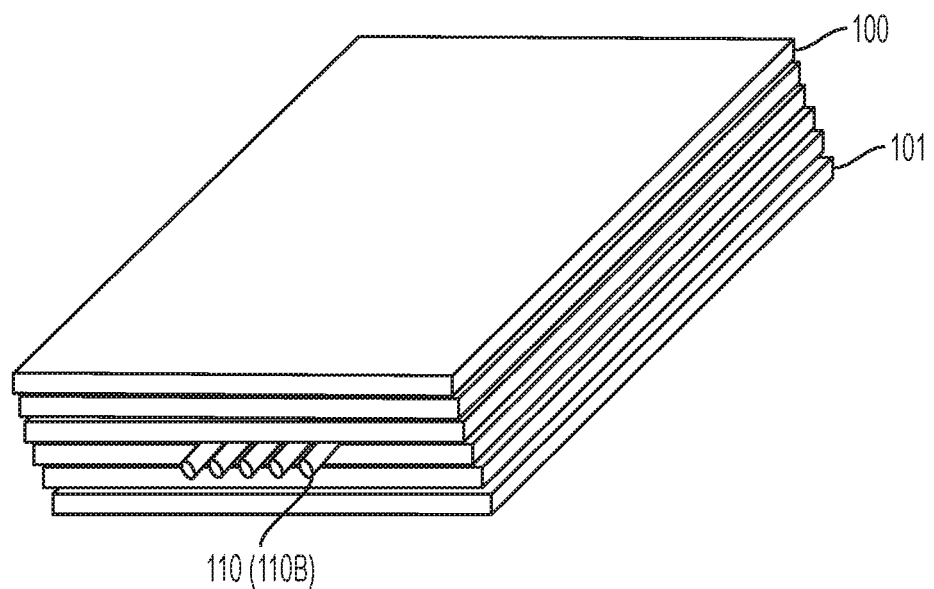
FIG. 2 is a simplified perspective view of a conventional method of adding cooling passages using fugitive rods showing the fugitive rods embedded in the CMC layup.

Fugitive materials have been used to create voids and passages in forming CMC components. For example, a plurality of layers of either fabric or pre-impregnated fabric with a matrix precursor are layered. At least one of the layers may be cut to have a groove or a channel into which a quartz rod or other fugitive material is fitted. Additional layers are then laid up to achieve the desired thickness of the component. One example of such a method is shown in FIGS. 1 and 2. In FIG. 1, layers of fabric or pre-impregnated fabric 100 are layered one atop another. At least one of the layers 101 may have a cut out or cut portion 112 dimensioned to receive a fugitive material 110, which may be a single or series of quartz rods for example. Further layers of fabric having a cut out or cut portion may be layered to correspond with the height of the fugitive material 110. After the desired height is reached, additional layers 100 are then layered on top of the cut out or cut material to fully embed the fugitive material 110 within the layup. If fabric layers are used, then the fabric layers are impregnated with a matrix material. In either of the methods involving pre-impregnated fabric and/or impregnated fabric, the composite material of fabric and matrix is cured. The curing may include any known method including heating in an autoclave either with or without pressure, for example. The curing process is generally achieved under conditions in which the fugitive material remains stable. After the curing process the component may be subject to temperatures high enough to cause a phase change of the fugitive material, thus leaving a passage in the completed CMC component where the fugitive material previously existed.

It is recognized that prior processes for providing cooling passages in CMC components usually relied solely on laser drilling or fugitive materials such as quartz rods as discussed above. In the current disclosure, a core and/or cooling passages formed as either a fugitive structure and/or as a structural or border element formed within the CMC material may be formed using digital light processing (DLP). DLP differs from more traditional powder bed and SLA processes in that the light curing of the polymer occurs through a window at the bottom of a resin tank that projects light upon a build platform that is raised as the process is conducted. With DLP an entire layer of cured polymer is produced simultaneously, and the need to scan a pattern using a laser is eliminated. Further, the polymerization occurs between the underlying window and the last cured layer of the object being built. The underlying window provides support allowing thin filaments of material to be produced without the need for a separate support structure. The fact that DLP exposes the entire length of the filament and supports it between the window and the build plate, enables producing sufficiently thin filaments to form an object having the desired cooling hole pattern. In the current disclosure, a core and/or cooling passages may be formed of a fugitive material and/or formed as non-fugitive hollow cooling passages to be embedded into the CMC. As one example, a core and/or cooling passages may be formed of Si, SiO, and SiO2 powder in the presence of organic (e.g. C—H—O) binders using a DLP process. The core and/or cooling passages may be embedded in a CMC component during the layup process. A binder burnout process may then be used to remove the organic binder. During melt infiltration, Si from the original ceramic composition or from the Si source introduced during the melt infiltration process may react with SiO2 for a volatile SiO phase. SiO from the original composition acts as the staple phase for evaporation. By forming cores and/or cooling passages using the abovementioned process either as a fugitive material and/or a material to be embedded in the completed CMC component, designers have more flexibly and may strategically position hollow structures within an CMC component.

One suitable DLP process is disclosed in U.S. Pat. No. 9,079,357 assigned to Ivoclar Vivadent AG and Technische Universitat Wien, as well as WO 2010/045950 A1 and US 2011310370, each of which are hereby incorporated by reference and discussed below with reference to FIGS. 3-7. In accordance with an exemplary embodiment of the present invention with reference to FIGS. 3-7, for example, an apparatus includes a tank 404 having at least one translucent bottom 406 covering at least a portion of an exposure unit 410. The exposure unit 410 may include, for example, a light source and modulator with which the intensity can be adjusted position-selectively under the control of a control unit, in order to produce an exposure field on the tank bottom 406 with the geometry desired for the layer currently to be formed. As an alternative, a laser may be used in the exposure unit 410, the light beam of which successively scans the exposure field with the desired intensity pattern by means of a mobile mirror, which is controlled by a control unit.

Opposite the exposure unit 410, a production platform 412 is provided above the tank 404; it is supported by a lifting mechanism (not shown) so that it is held in a height-adjustable way over the tank bottom 406 in the region above the exposure unit 410. The production platform 412 may likewise be transparent or translucent in order that light can be shone in by a further exposure unit, for example, above the production platform 412 in such a way that, at least when forming the first layer on the lower side of the production platform 412, it can also be exposed from above so that the layer cured first on the production platform adheres thereto with even greater reliability.

The tank 404 contains a filling of highly viscous photopolymerizable material 420. The material level of the filling is higher than the thickness of the layers which are intended to be defined for position-selective exposure. In order to define a layer of photopolymerizable material, the following procedure is adopted. The production platform 412 is lowered by the lifting mechanism in a controlled way so that (before the first exposure step) its lower side is immersed in the filling of photopolymerizable material 420 and approaches the tank bottom 406 to such an extent that precisely the desired layer thickness Δ (see FIG. 4) remains between the lower side of the production platform 412 and the tank bottom 406. During this immersion process, photopolymerizable material is displaced from the gap between the lower side of the production platform 412 and the tank bottom 406. After the layer thickness Δ has been set, the desired position-selective layer exposure is carried out for this layer, in order to cure it in the desired shape. Particularly when forming the first layer, exposure from above may also take place through the transparent or translucent production platform 412, so that reliable and complete curing takes place particularly in the contact region between the lower side of the production platform 412 and the photopolymerizable material, and therefore good adhesion of the first layer to the production platform 412 is ensured. After the layer has been formed, the production platform 412 is raised again by means of the lifting mechanism.

These steps are subsequently repeated several times, the distance from the lower side of the layer 422 formed last to the tank bottom 406 respectively being set to the desired layer thickness Δ, and the next layer thereupon being cured position-selectively in the desired way.

Figure 3:
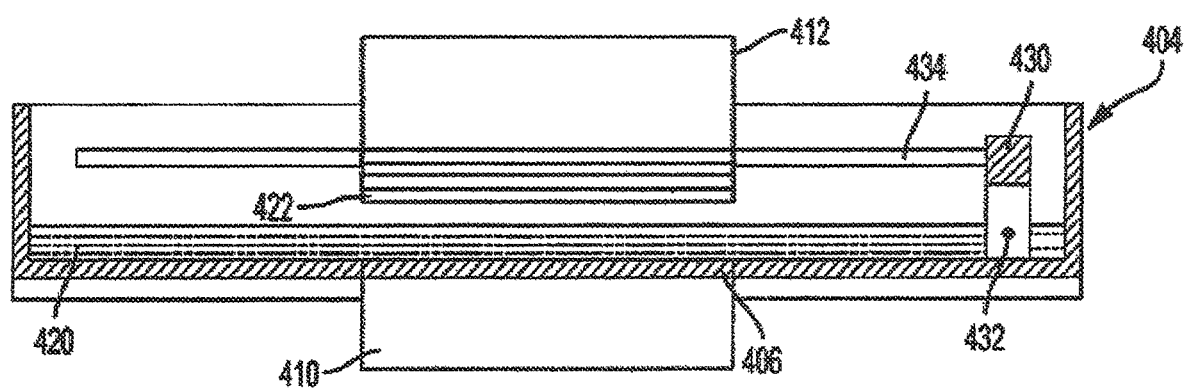
FIGS. 3-6 show schematic lateral sectional views of a device for carrying out successive phases of the method sequence for digital light processing (DLP)
Figure 4:
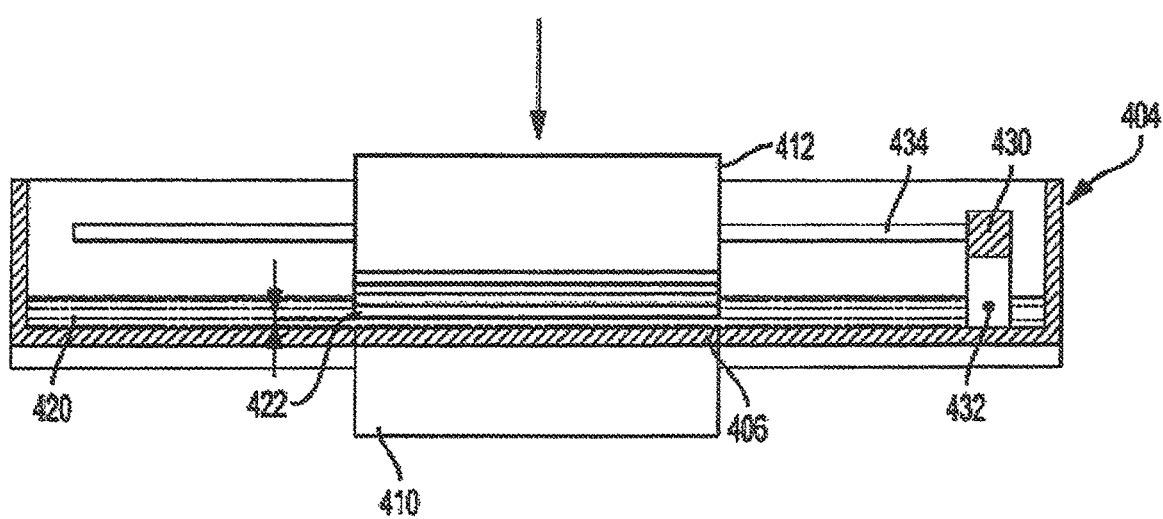

After the production platform 412 has been raised following an exposure step, there is a material deficit in the exposed region as indicated in FIG. 3. This is because after curing the layer set with the thickness Δ, the material of this layer is cured and raised with the production platform 412 and the part of the shaped body already formed thereon. The photopolymerizable material therefore missing between the lower side of the already formed shaped body part and the tank bottom 406 must be filled from the filling of photopolymerizable material 420 from the region surrounding the exposed region. Owing to the high viscosity of the material, however, it does not flow by itself back into the exposed region between the lower side of the shaped body part and the tank bottom, so that material depressions or "holes" can remain here.

Figure 5:
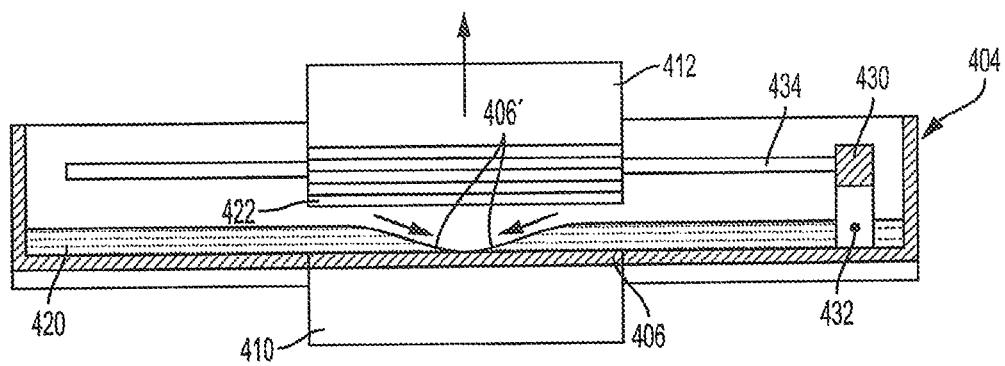
Figure 6:
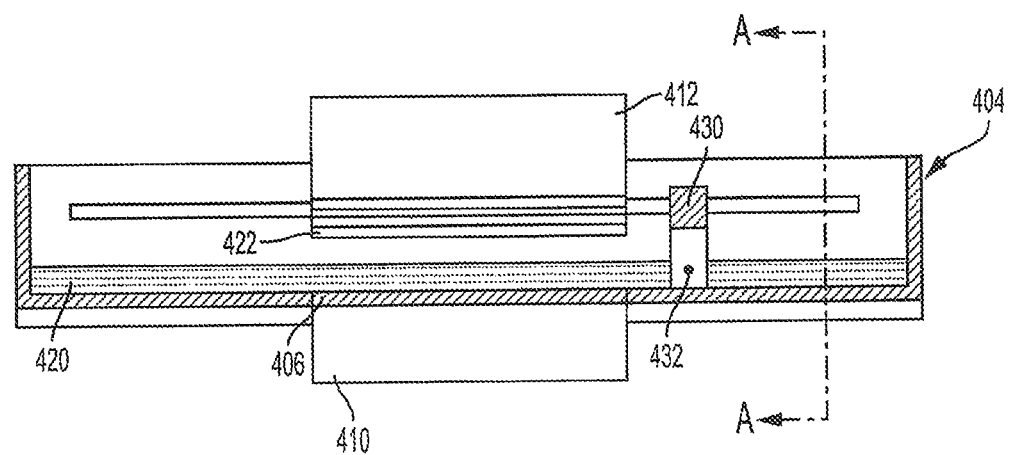
Figure 7:
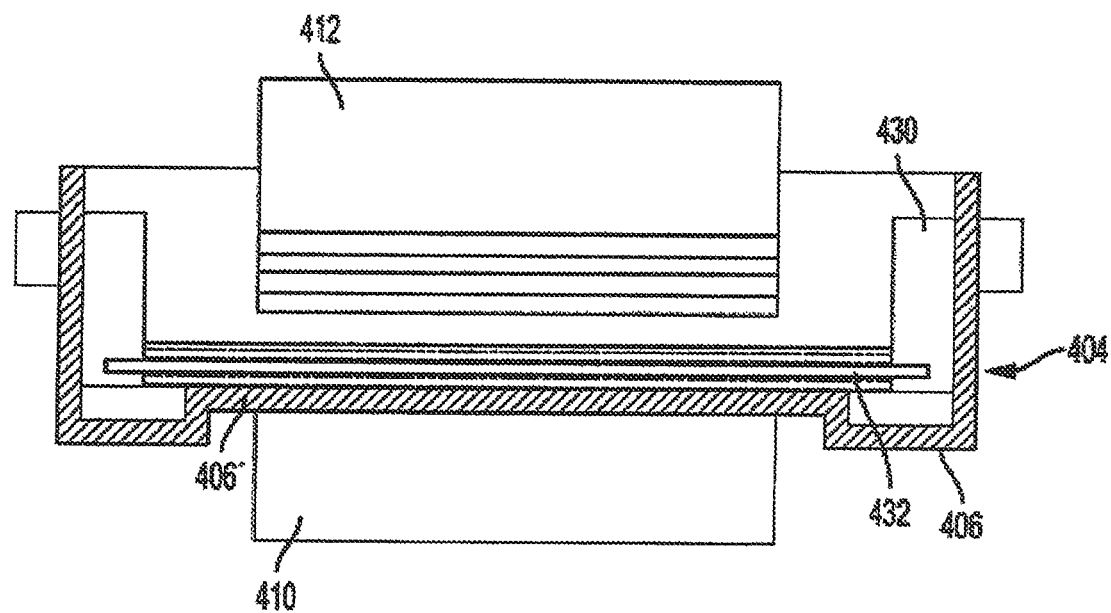
FIG. 7 shows a schematic sectional view along the line A-A of FIG. 6.

In order to replenish the exposure region with photopolymerizable material, an elongate mixing element 432 is moved through the filling of photopolymerizable material 420 in the tank 404. In the exemplary embodiment represented in FIGS. 3 to 5, the mixing element 432 includes, for example, an elongate wire (not shown) which is tensioned between support arms 430 mounted movably on the side walls of the tank 404. The support arms 430 may be mounted movably in guide slots 434 in the side walls of the tank 404, so that the wire tensioned between the support arms 430 can be moved relative to the tank 404, parallel to the tank bottom 406, by moving the support arms 430 in the guide slots 434. The elongate mixing element 432 has dimensions and its movement is guided relative to the tank bottom 406, such that the upper edge of the elongate mixing element 432 remains above the material level of the filling of photopolymerizable material 420 in the tank outside the exposed region. As can be seen in the sectional view of FIG. 5, the mixing element 432 is below the material level in the tank over the entire length of the wire, and only the support arms 430 protrude beyond the material level in the tank. The effect of arranging the elongate mixing element 432 below the material level in the tank 404 is not that the elongate mixing element 432 substantially moves material in front of it during its movement relative to the tank through the exposed region, but rather this material flows over the mixing element 432 while executing a slight upward movement. The movement of the mixing element 432 from the position shown in FIG. 5 to, for example, a new position in the direction indicated by the arrow A, is shown in FIG. 6. It has been found that by this type of action on the photopolymerizable material in the tank, the material is effectively stimulated to flow back into the material-depleted exposed region between the production platform 412 and the exposure unit 410.

The movement of the elongate mixing element 432 relative to the tank 404 may be carried out by a linear drive which moves the support arms 430 along the guide slots 434 in order to achieve the desired movement of the elongate mixing element 432 through the exposed region between the production platform 412 and the exposure unit 410. As shown in FIG. 5, the tank bottom 406 has recesses 406' on both sides. The support arms 430 project with their lower ends into these recesses 406'. This makes it possible for the elongate mixing element 432 to be held at the height of the tank bottom 406, without interfering with the movement of the lower ends of the support arms 430 through the tank bottom 406.

Other alternative methods of DLP may be used to prepare the integrated core-shell molds of the present invention. For example, the tank may be positioned on a rotatable platform. When the workpiece is withdrawn from the viscous polymer between successive build steps, the tank may be rotated relative to the platform and light source to provide a fresh layer of viscous polymer in which to dip the build platform for building the successive layers.

Figure 8:
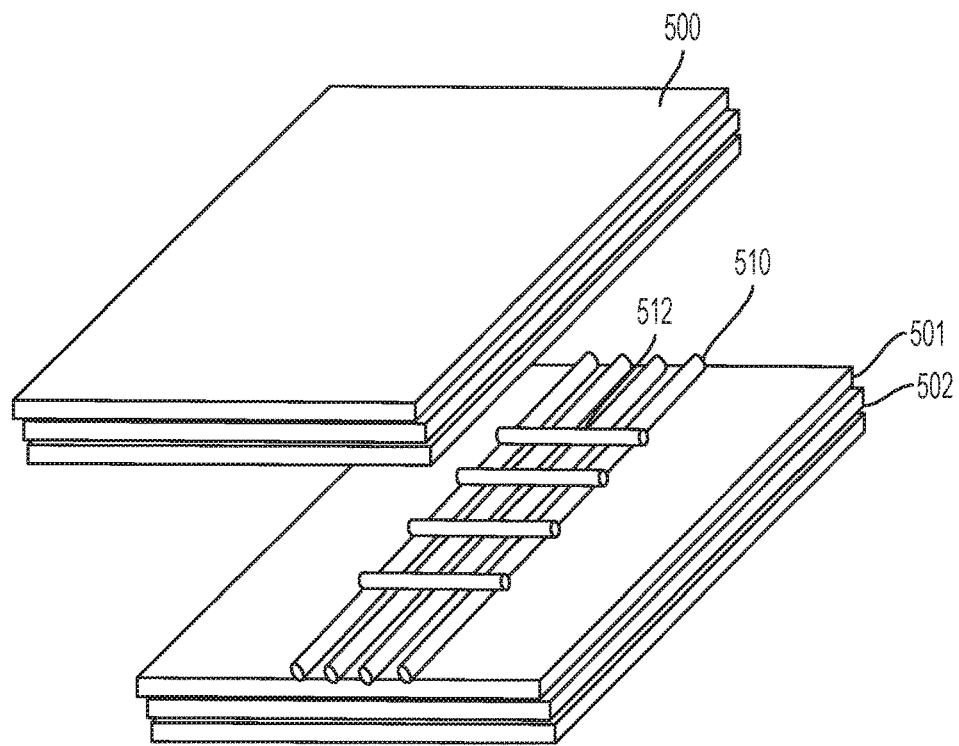
FIG. 8 is a simplified perspective view of a method of adding cooling passages using to a CMC structure in accordance with one aspect of the disclosure.
Figure 9:
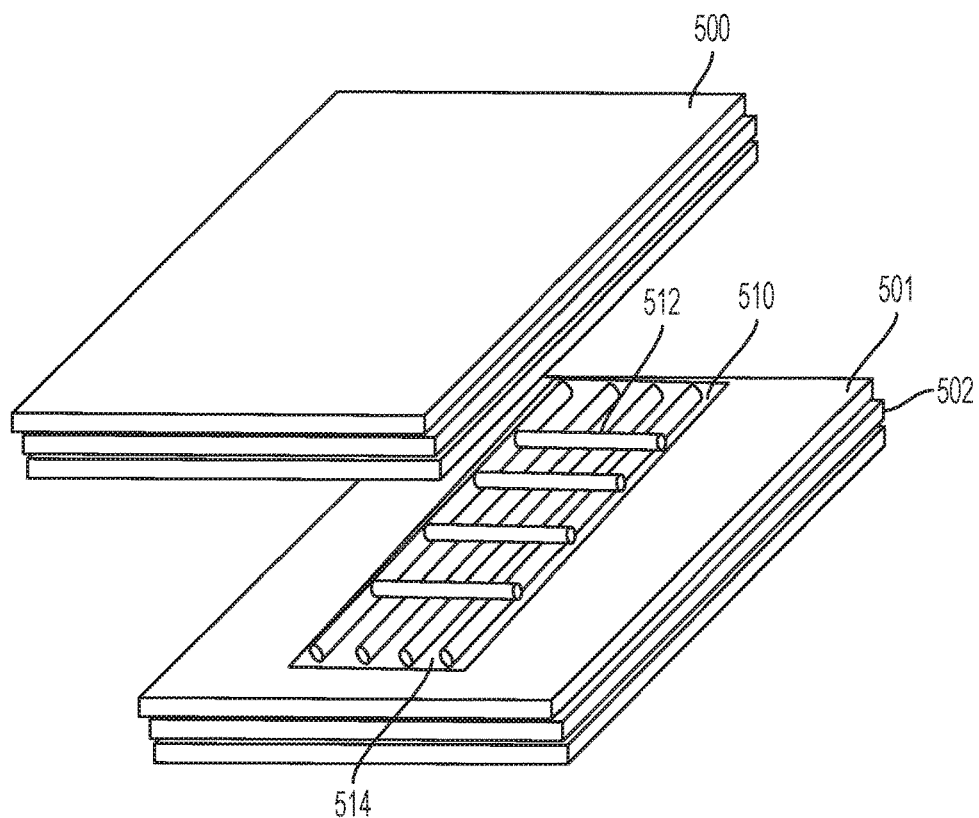
FIG. 9 is a simplified perspective view of a method of adding cooling passages using to a CMC structure in accordance with one aspect of the disclosure.

As shown in FIGS. 8 and 9, in one aspect of the current disclosure, fugitive graphite tubes and/or rods 512 may be used to create cavities with an CMC component. For example, a plurality of layers of either fabric or pre-impregnated fabric 500, 501 with a matrix precursor may be layered into a die or mold (not shown). At least one of the layers 501 may be cut to have a groove or a channel 514 into which graphite tubes 512 are placed. As an alternative, as shown in FIG. 8, the graphite tubes and/or rods may be placed on a layer of fabric 501 that is not cut to have a groove or channel. Additional layers 500 are then laid up to achieve the desired thickness of the component. In FIG. 8, layers of fabric or pre-impregnated fabric 502 are layered one atop another. At least one of the layers 501 may have a cut out or cut portion 514 dimensioned to receive a graphite rod or series of graphite rods 510. As another example, the graphite rods and/or tubes 510 may be connected with connecting rods and/or tubes 512. Further layers of fabric 501 having a cut out or cut portion 514 may be layered to correspond with the height of the graphite rods and/or tubes 510 and/or the connecting rods and/or tubes 512. After the desired height is reached, additional layers 500 are then layered on top of the cut out or cut material to fully embed the graphite tubes and/or rods 510 and/or 512 within the layup. If fabric layers are used, then the fabric layers are impregnated with a matrix material. For example, a chemical vapor infiltration (CVI), melt infiltration (MI), and/or polymer impregnation and pyrolysis (PIP) process may be used. In either of the methods involving pre-impregnated fabric and/or impregnated fabric, the composite material of fabric and matrix is cured. The curing may include any known method including heating in an autoclave either with or without pressure, for example. The curing process may be achieved under conditions in which the graphite material remains stable. After the curing process the component may be subject to temperatures high enough to cause a phase change of the graphite material, thus leaving a passage in the completed CMC component where the graphite rods/tubes 510 and/or connecting rods/tubes 512 material previously existed.

The methods mentioned throughout may be applicable to any method of forming a CMC component. A CVI method may be used to form the CMC component. As one example of a CVI method, a gas phase SiC precursor is used to form SiC structures within a preform. A gas phase precursor is then infiltrated into the preform to densify and create a matrix phase. A MI method may also be used. In one example of a MI method, an SiC particulate slurry may be dispersed within a fibrous preform. As an alternative or in combination with the abovementioned MI method, a CVI may be used to coat carbon on the SiC fibers, for example. The above-mentioned steps may be followed with a liquid Si being infiltrated to react with the carbon to form SiC. A PIP method may also be used to form a CMC component. As one example of a PIP method, polymeric SiC precursors may be infiltrated into a fibrous preform to create a SiC matrix. This method yields low stoichiometry as well as crystallinity due to the polymer-to-ceramic conversion process. In all of the above-mentioned processes, multiple infiltrations can be performed to compensate for the shrinkage.

In the abovementioned example using graphite tubes, the graphite rods/tubes 512 and 510 may be tubes having a hollow center. It may be desired to provide the graphite rods from a material that is not fugitive and thus remains in the finished CMC component. In such an embodiment the inner hollow portions of the tubes 510 and/or 512 would define passages in the CMC component once curing is completed.

Figure 10:
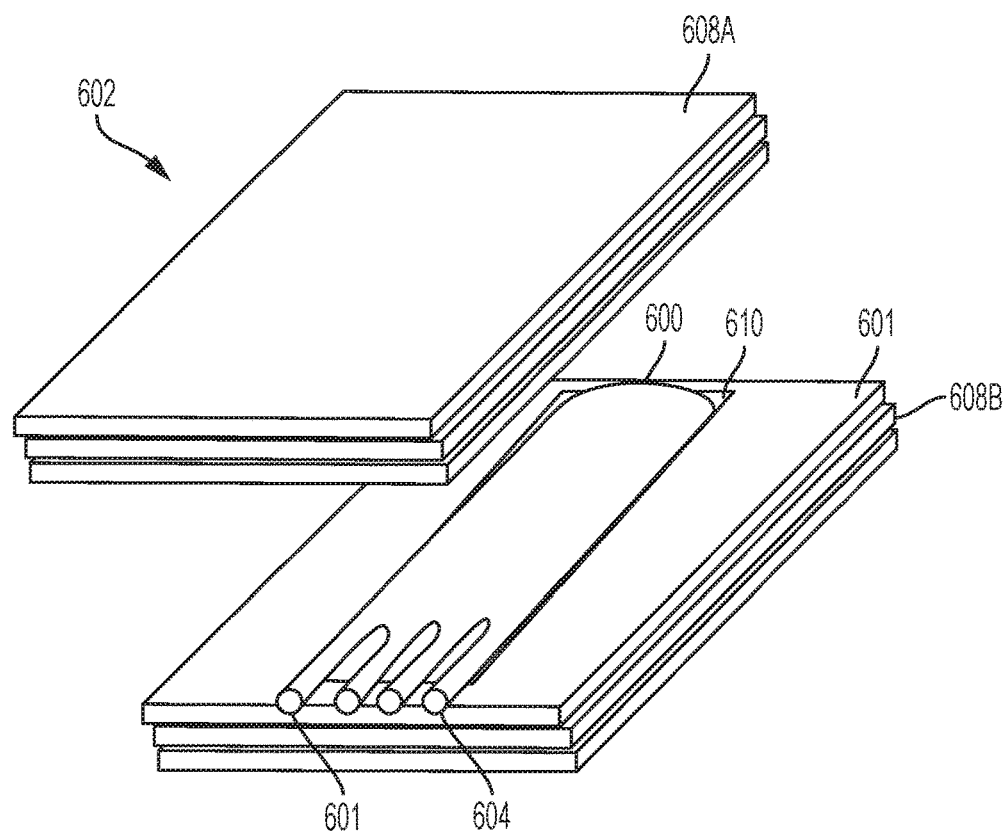
FIG. 10 is a partial simplified perspective view of a CMC component having a fugitive core and cooling passages in accordance with one aspect of the disclosure.

In another example shown in FIG. 10, a fugitive core may be produced using additive manufacturing. For example, a fugitive core 600 and/or fugitive cooling passages 601, 604 may be manufactured using the abovementioned DLP process. As one example, the fugitive core 600 and/or fugitive cooling passages 601, 604 may be formed of any one or a combination of Silicon (Si), Silicon Monoxide (SiO), and Silica (SiO2) powder in the presence of organic binders (e.g. C—H—O) using an additive manufacturing process (e.g. DLP). During a layup process The fugitive core 600 and/or fugitive cooling passages 601, 604 may be embedded in a CMC component 602 during the layup process. For example, a plurality of layers 608A-B of either fabric or pre-impregnated fabric 608A-B with a matrix precursor may be layered into a die or mold (not shown). At least one of the layers 601 of the fabric 608A-B may be cut to have a groove or a channel 610 into which the fugitive core 600 and/or passages 601, 604 is fit. As an alternative, the fugitive core 600 and/or passages 601, 604 may be placed on a layer of fabric 608 that is not cut to have a groove or channel. Additional layers of fabric 601A-B are then laid up to achieve the desired thickness of the component. In FIG. 10, layers of fabric and/or pre-impregnated fabric 608 are layered one atop another (e.g. similar to the layers in FIGS. 8 and 9) and densified using any of the abovementioned methods to form a densified component 708. At least one of the layers may have a cut out or cut portion 610 dimensioned to receive a the fugitive core 600 and/or fugitive cooling passages 601 and 604.

Figure 11:
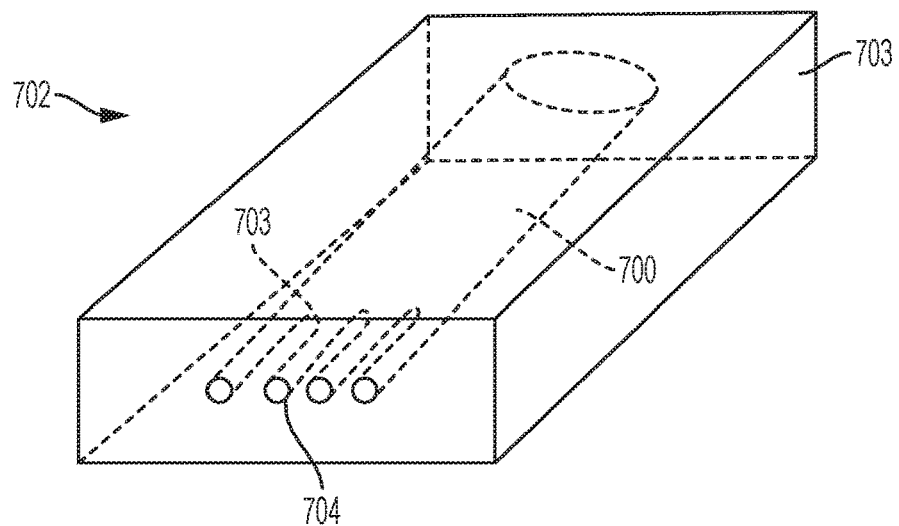
FIG. 11 is a simplified plan view of a CMC component having a core and cooling passages in accordance with one aspect of the disclosure.

It is noted that the structure of the component is not limited to the simplified example shown in FIGS. 10 and 11, the above-mentioned methods may be used to form any component, for example, at least a portion of at least one of a shroud, combustion liner, fuel nozzle, swirler, compressor blade, turbine blade, and turbine vein. Using the method discussed throughout the disclosure, virtually any type of cooling channel and/or passageway design may be incorporated into an CMC component. The abovementioned production methods allow for non-linear portions, an example of which is shown at reference 703 to be produced within the CMC structure. Based on the disclosure, one having skill in the art would understand that the disclosed novel fugitive core and/or cooling passages may be used with any type of CMC manufacturing process.

For example, if fabric layers are used, then the fabric layers may be impregnated with a matrix material as a separate step or may be provided as pre-impregnated fabric. Several non-limiting examples are listed below and are non-exhaustive. For example, a CVI method may be used to form the CMC component. As one example of a CVI method, a gas phase SiC precursor is used to form SiC structures within a preform. A gas phase precursor is then infiltrated into the preform to densify and create a matrix phase. A MI method may also be used. In one example of a MI method, an SiC particulate slurry may be dispersed within a fibrous preform. As an alternative or in combination with the abovementioned MI method, a CVI may be used to coat carbon on the SiC fibers, for example. The abovementioned steps may be followed with a liquid Si being infiltrated to react with the carbon to form SiC. A PIP method may also be used to form a CMC component. As one example of a PIP method, polymeric SiC precursors may be infiltrated into a fibrous preform to create a SiC matrix. This method yields low stoichiometry as well as crystallinity due to the polymer-to-ceramic conversion process. In all of the above-mentioned processes, multiple infiltrations can be performed to compensate for the shrinkage. In either of the methods involving pre-impregnated fabric and/or impregnated fabric, the composite material of fabric and matrix is cured. The curing may include any known method including heating in an autoclave either with or without pressure, for example. The curing process may be achieved under conditions in which the material forming the fugitive core 600 and/or fugitive cooling passages 601, 604 may remain stable. After the curing process, the laid up component 602 may be subject to temperatures high enough to cause a phase change of the fugitive core 600 and/or fugitive cooling passage 601, 604 material, thus leaving a core passage 700 and/or cooling channels 701, 704 in the completed CMC component where the fugitive core material 600 and/or fugitive cooling passage material 601, 604 previously existed. A binder burnout process may be used to remove the organic binder. In the above example using Si, SiO2, and SiO, during melt infiltration, Si from the original composition or from the Si source introduced during the melt infiltration process may react with SiO2 for a volatile SiO phase. SiO from the original composition acts as the staple phase for evaporation. By forming the fugitive cores 600 and/or fugitive cooling passages 601, 604 using the abovementioned process as a fugitive material, designers have more flexibly and may strategically position hollow structures within a CMC component.

Figure 12:
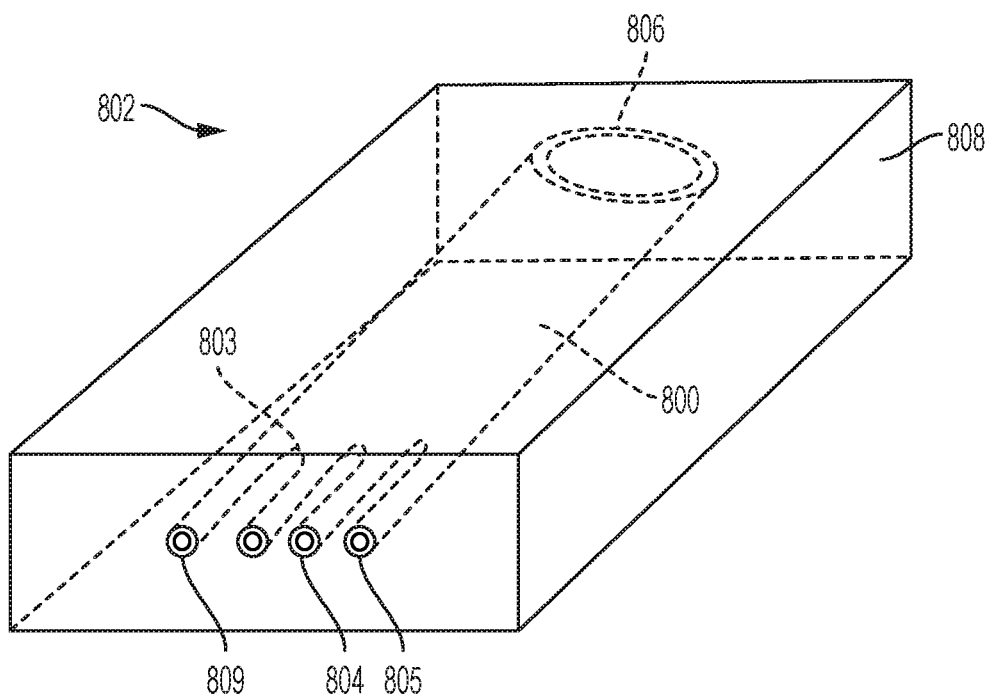
FIG. 12 is a simplified plan view of a CMC component having a core and cooling passages in accordance with one aspect of the disclosure.

In another example discussed with reference to FIG. 12, a non-fugitive hollow core 800 and/or cooling passages 804, 805 may be produced using additive manufacturing. For example, a hollow core 800 and/or cooling passages 801, 804 may be manufactured using the abovementioned DLP process. As one example, the hollow core 800 and/or hollow cooling passages 804, 805 within an additively manufactured wall 809, 803, and 806, which may include non-linear portions 803 may be formed using an additive manufacturing process (e.g. DLP). During a layup process, the core enclosing the cavity 800 and/or cooling passages 804, 805 may be embedded in a CMC component during the layup process. For example, a similar process may be used as shown in FIGS. 10 and 11, that is a plurality of layers of either fabric or pre-impregnated fabric 601, 608A-B with a matrix precursor may be layered into a die or mold (not shown). At least one of the layers 601 of the fabric 601, 608A-B may be cut to have a groove or a channel 610 into which the core 600 and/or passages 601, 604 is fit. As an alternative, the core 600 and/or passages 601, 604 may be placed on a layer of fabric that is not cut to have a groove or channel. Additional layers of fabric are then laid up to achieve the desired thickness of the component. In FIG. 12, layers of the fabric or pre-impregnated fabric 808 are layered one atop another (e.g. similar to the layers in FIGS. 8-11). It is noted that the structure of the component is not limited to the example shown in FIGS. 10-12. Using the method discussed throughout the disclosure, virtually any type of cooling channel and/or passageway design may be incorporated into an CMC component. Based on the disclosure, one having skill in the art would understand that the disclosed novel core and/or cooling passages may be used with any type of CMC manufacturing process. For example, if fabric layers are used, then the fabric layers may be impregnated with a matrix material and any of the methods mentioned throughout the disclosure or known in the art may be used. In either of the methods involving pre-impregnated fabric and/or impregnated fabric, the composite material of fabric and matrix is cured. The curing may include any known method including heating in an autoclave either with or without pressure, for example. The curing process may be achieved under conditions in which the material forming the wall 803, 806, and 809 surrounding the core 800 and/or cooling passages 804, 805 remains stable. After the curing process the laid up component 802 includes the core passage 800 and/or cooling voids 801, 804 in the completed CMC component bounded by the additively manufactured wall structure 803, 806, and 809. Thus a CMC component is formed having the core and/or cooling passages permanently embedded within the completed component. By forming the cores 800 and/or cooling passages 804, 805 using the abovementioned process as a material to be embedded in the completed CMC component, designers have more flexibly and may strategically position hollow linear and non-linear shaped structures within an CMC component. In all of the abovementioned embodiments, It can be appreciated that other cooling channel geometries (e.g., circular) can be utilized for fabrication of the cooling channels without departing from the scope of the present invention.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Aspects from the various embodiments described, as well as other known equivalents for each such aspect, can be mixed and matched by one of ordinary skill in the art to construct additional embodiments and techniques in accordance with principles of this application.

What is claimed is:

1. A method of fabricating a composite component comprising: at least partially covering a core having an organic binder and at least a silicon component with a reinforcing fiber material, wherein the core is a non-fugitive hollow core which includes at least one portion having a non-linear geometry, wherein the non-fugitive hollow core is formed by:
  (a) contacting a cured portion of a workpiece with a liquid photopolymer;
  (b) irradiating a portion of the liquid photopolymer adjacent to the cured portion through a window contacting the liquid photopolymer; and
  (c) removing the workpiece from the uncured liquid photopolymer; wherein the non-fugitive hollow core comprises at least one hollow passage, wherein the hollow passage defines at least one cooling passage, wherein at least partially covering the core further comprises:
placing the non-fugitive hollow core on at least one first layer of the reinforced fiber material, wherein the reinforced fiber material is pre-impregnated with a ceramic matrix precursor material, wherein the at least one first layer comprises a plurality of layers of either fabric or pre-impregnated fabric with a matrix precursor: and
adding at least one second layer of pre-impregnated reinforcing fiber material on top of the non-fugitive hollow core, wherein the at least one second layer comprises a plurality of layers of fabric or pre impregnated fabric, wherein the at least one first layer and the at least one second layer are densified to consolidate the at least one first layer and the at least one second layer of reinforcing fiber material.

2. The method of claim 1, wherein the silicon component comprises at least one of Si, SiO, and SiO2.

3. The method of claim 1, further comprising:
performing an infiltration process with a ceramic matrix precursor material, wherein the precursor is densified and consolidates the at least one first layer and the at least one second layer of the reinforcing fiber material into a densified composite, wherein the non-fugitive hollow core defines the at least one cooling passage in the densified composite component.

4. The method of claim 1, wherein the reinforcing fiber material is pre-impregnated with a ceramic matrix precursor material.

5. The method of claim 1, wherein the organic binder is C—H—O.

6. The method of claim 3, wherein the infiltration process is a chemical vapor infiltration.

7. The method of claim 3, wherein the infiltration process is a melt infiltration.

8. The method of claim 3, wherein the infiltration process is a polymer impregnation and pyrolysis.

9. The method of claim 1, wherein the composite component is at least a portion of at least one of a shroud, combustion liner, fuel nozzle, swirler, compressor blade, turbine blade, and turbine vein.

* * * * *